United States Patent [19]

Voss

[11] 3,968,512
[45] July 6, 1976

[54] THYRISTOR

[75] Inventor: Peter Voss, Munich, Germany

[73] Assignee: Siemens Aktiengesellschaft, Berlin & Munich, Germany

[22] Filed: Nov. 6, 1974

[21] Appl. No.: 521,387

[30] Foreign Application Priority Data
Nov. 14, 1973   Germany............................ 2356906

[52] U.S. Cl.................................. 357/38; 357/20; 357/36
[51] Int. Cl.²........................................ H01L 29/74
[58] Field of Search ................... 357/38, 39, 20, 34, 357/36

[56] References Cited
UNITED STATES PATENTS

| | | | |
|---|---|---|---|
| 3,214,652 | 10/1965 | Knowles................................ | 357/20 |
| 3,590,346 | 6/1971 | Bilo et al. ......................... | 357/38 X |
| 3,777,229 | 12/1973 | Burtscher et al. ................. | 357/38 X |

OTHER PUBLICATIONS

Voss, "The Turn-on of Thyristors With Internal Gate Current Amplification", Paper Presented at the IEEE Meeting in Pittsburgh, Pa. in Oct. 1974.

Primary Examiner—R. V. Rolinec
Assistant Examiner—Darwin R. Hostetter
Attorney, Agent, or Firm—Hill, Gross, Simpson, Van Santen, Steadman, Chiara & Simpson

[57] ABSTRACT

A thyristor including a semiconductor element which comprises a main thyristor and at least one auxiliary arrangement operative to amplify the control current, the main thyristor having a main emitter and the auxiliary arrangement having an auxiliary emitter, a base being common to both the main thyristor and the auxiliary arrangement, and pn-junctions disposed between the base and respective emitters, emitter electrodes being disposed upon the respective emitters, and a control electrode connected to the base, in which the edge length ($1_E$) of the respective emitters is such that the current is $i_e > i_{ii}$ ($i_{e1} 22\ i_{ii1}$, $i_{e2} > i_{u2}$ etc.), where $i_e$ is, in each case, the product of emitter length ($1_E$) and a line current density $j_e$ of between 0.3 and 1.0 A/mm edge length and the current $i_{ii}$ is that load current at which the voltage across the thyristor has fallen at least to a value of 10% of the breakover voltage, the emitters, the emitter electrodes and the control electrode being, at least in part, of strip configuration and interlaced with one another in the manner of combs. The ratios of the emitter edge lengths of the auxiliary arrangement of arrangements with respect to the main thyristor are between 1:2 and 1:5, preferably 1:3, and the auxiliary arrangement may be a thyristor or a transistor.

14 Claims, 7 Drawing Figures

3,968,512

THYRISTOR

BACKGROUND OF THE INVENTION

The invention is directed to a thyristor employing a semi-conductor element which includes a main thyristor and at least one auxiliary arrangement operative to amplify the control current, with the main thyristor having an emitter (termed the main emitter) and the auxiliary arrangement having also an emitter (termed the auxiliary emitter), a base being common to both the main thyristor and the auxiliary arrangement, with pn-junctions being disposed between the base and emitters, and provided with emitter electrodes disposed on the respective emitters and a control electrode which is connected to the base.

Thyristors of this type are known and, for example, have been described in German OS 1,639,019. The auxiliary arrangement has the function of amplifying the control currents supplied to the control electrode of the thyristor whereby it is possible to keep the control current low and at the same time apply a current to the main thyristor of sufficient magnitude for uniform ignition.

Experiments with infrared-photography have shown that in a thyristor of this type, the load current in the auxiliary arrangement initially flows in a linearly extended zone. However, in the course of a few tenths of a microsecond such linear zone is constricted to a substantially shorter, smaller area which must then temporarily conduct virtually the entire load current. In the case of a steep-gradient current rise of several 100 A/µs, as controlled by the external circuitry, considerable heating takes place in such small area. In particular, at high repetition frequencies, destruction of the thyristor can result.

SUMMARY OF THE INVENTION

The present invention is based on the recognition that the aforementioned constriction of the ignition zone occurs only when the voltage connected to the thyristor is greater than approximately 10% of the breakover voltage, i.e., the voltage applied to the main path of the thyristor, at which the thyristor is triggered into its low impedance state without the supply of control current. It also has been recognized that the constriction of the ignition zone occurs only when the current flowing through the thyristor exceeds a specific value which, in dependence upon the type of thyristor involved, is between 0.3 and 1.0 A/mm of the length of the emitter edge. The invention therefore is directed to the production of a thyristor, of the type initially described, in which the occurrence of the previously mentioned constriction of the ignition zone is prevented, both in the main thyristor and in the auxiliary arrangement, or in the event several auxiliary arrangements are employed, in all of such auxiliary arrangements.

In the practice of the invention, the edge length of the respective emitters is so selected that for both the main thyristor and the auxiliary arrangement or arrangements, the current $i_e > i''_u$ ($i_{e1} > i''_{u1}$, $i_{e2} > i''_{u2}$ etc.), wherein $i_e$ is, in each case, the product of emitter length ($1_E$) and a line current density $j_e$ which lies between 0.3 and 1.0 A/mm of the edge length, and wherein $i''_u$ is the load current at which the voltage applied to the thyristor has dropped at least to a value of 10% of the breakover voltage. The necessary long edge lengths expediently may be derived in the respective emitters, the emitter electrodes and the control electrode by the utilization, at least in part, of a strip configuration which are designed to interlace in the manner of comb structures. Expediently, it is possible to provide, instead of a single auxiliary arrangement, a plurality of series-connected auxiliary arrangements disposed between the control electrode and the main thyristor. The ratios of the edge lengths of the respective consecutive auxiliary arrangements and of the last auxiliary arrangement with respect to the main thyristor can be between 1:2 and 1:5, preferably 1:3.

BRIEF DESCRIPTION OF THE DRAWINGS

In the drawings wherein like reference characters indicate like or corresponding parts.

DETAILED DESCRIPTION OF THE INVENTION

Figure 1:
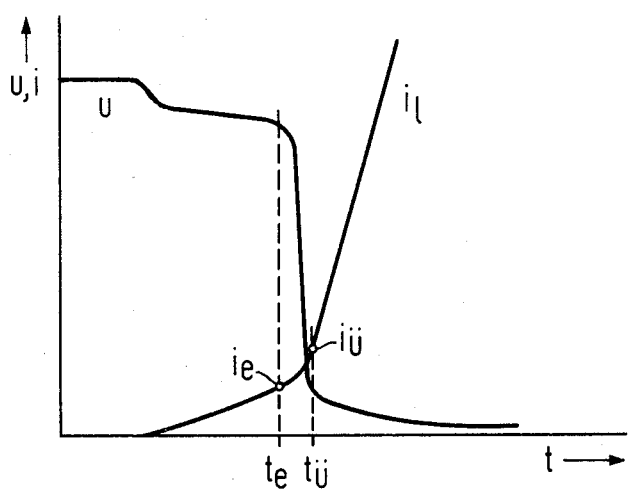
FIG. 1 is a graph illustrating current and voltage courses in a conventional thyristor.

Referring to FIG. 1, the voltage and current paths of a conventional thyristor, under an inductive load, are plotted with respect to time. It will be noted that the load current flowing through the thyristor initially rises substantially linearly and quite flatly until the time $t_e$. Up to this time the load current is fundamentally governed by the thyristor and to a lesser extent by the inductive load connected thereto. The voltage connected to the thyristor, until this time, thus drops only slightly. Until the time $t_e$ the load current flows through a line-shaped area. However, at the time $t_e$, the constriction of the ignition line commences and subsequent to the time $t''_u$, the load current of the thyristor is governed basically only by the inductive load of the thyristor and is negligibly governed by the properties of the thyristor itself. As a result, the load current $i_L$ can rise very steeply in accordance with the magnitude of the inductive load, and reach $di/dt$ values of above 100A/µs. Constriction of the ignition line thus commences at the current value designated $i_e$.

Such current value $i_e$ is a product of a line current density $j_e$ and the emitter edge length $1_E$ of the thyristor. The specific current value at which the constriction of the ignition zone commences is approximately 0.3 – 1.0 A/mm of the emitter edge length, in dependence upon the thyristor construction, i.e., in dependence upon the thickness of the zones and upon the doping profile. Such value can readily be determined for any thyristor device having a known emitter edge length, as determined by the bend in the load current path, which is very sharp, in particular, at high $di/dt$ values. The graph discloses that the current value $i_e$ is reached before the voltage across the thyristor has disintegrated. At this time the voltage, for example, may amount to approximately 30% of the breakover voltage and under these conditions the initial turn-on line is restricted to a small area. As such area must conduct the entire load current, at high $di/dt$ values determined by the load, it will be overloaded and the thyristor will be destroyed.

Figure 2:
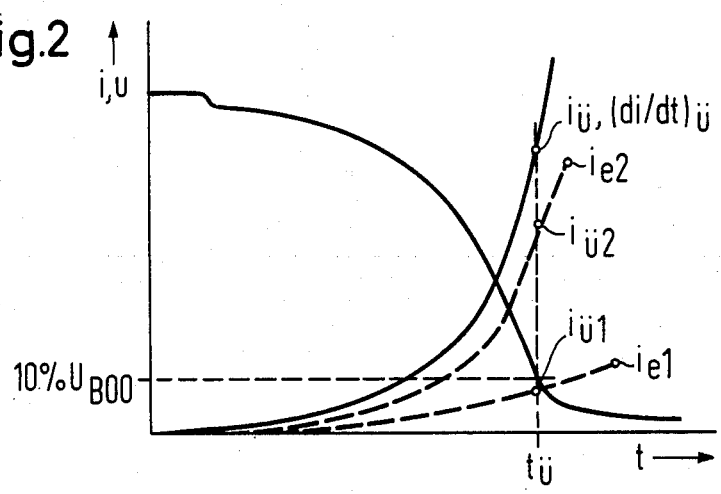
FIG. 2 is a similar graph illustrating current-voltage courses of an exemplary embodiment of the invention employing a single auxiliary arrangement.

FIG. 2 illustrates the current and voltage courses for a thyristor having a single auxiliary arrangement in accordance with the invention with the load current $i_L$ being the sum of the two previously mentioned subsidiary load currents. The current value at which the constriction of the ignition zone takes place in the main thyristor is designated by the reference $i_{e2}$ and the corresponding current value in the auxiliary arrangement is designated $i_{e1}$. The time at which the voltage connected to the thyristor has fallen to a value below 10% of the breakover voltage is designated $t_u''$ and the corresponding current values are designated $i_{u1}''$ and $i_{u2}''$.

To avoid constriction of the ignition zone occurring both in the main thyristor and in the auxiliary arrangement, the current $i_{e1}$ must be greater than the current $i_{u1}''$ and the current $i_{e2}$ must be greater than the current $i_{u2}''$. This can be achieved by appropriately dimensioning of the respective emitter edge lengths of the main thyristor and the associated auxiliary arrangement.

Figure 3:
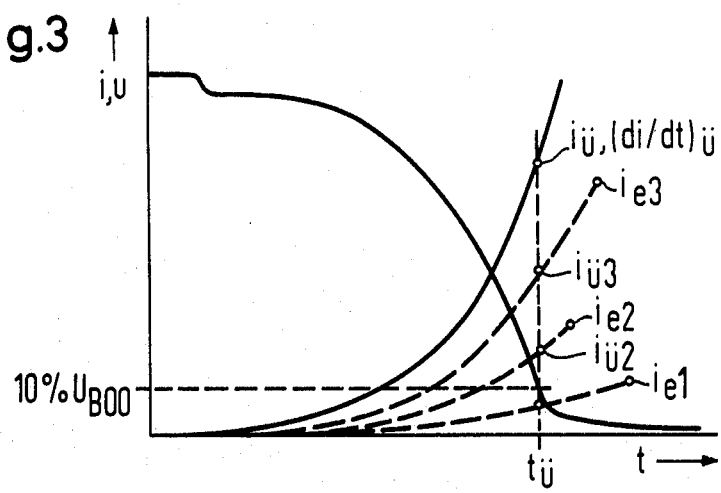
FIG. 3 is a graph showing current-voltage courses of an exemplary embodiment of the invention employing two auxiliary arrangements.

FIG. 3 illustrates the current-voltage courses of a thyristor comprising a main thyristor and two series-connected auxiliary arrangements. The dimensioning of the additional arrangement is governed by the same principles as in the case of a thyristor with a single auxiliary arrangement. However, a thyristor having two auxiliary arrangements permits a much steeper rise in current to be achieved than a thyristor with merely a single auxiliary arrangement.

In the dimensioning of the emitter edge length of the overall arrangement, experiments can initially be effected on a thyristor member of arbitrary but known emitter edge length. First the structure is checked to determine how rapidly the load current rises under various circuit conditions, such as output voltage, control current density and load circuit inductance. Next the line current density at which the ignition zone is constricted is determined and the current density $j_e$ is derived from the quotient of the current at which the ignition zone is constricted and the known emitter edge length $l_E$. Assuming the current $i_e$ will be 10A with a known edge length of, for example 10mm, the line current density $j_e$ has a value of 1 A/mm.

The dimensioning is now determined by the desired maximum rise in load current and the measured, general thyristor properties, i.e., in particular the turn-on speed of the thyristor. For example, assuming that the load current rises as a function of the third power, the equation $$i_u'' = \frac{(di/dt)(\text{index})_u''}{3} t_u'',$$

may be derived, in which $(di/dt)_u''$ is the rate of change of current at the time $t_u''$. The turn-on time $t_u''$ basically is determined by the thyristor properties. For example, at a desired $(di/dt)_u$ of 100 A/μs, it will be assumed to have a value of 2 μs. The current $i_u''$ is then 70A.

At a current density $j_e = 0.3$ A/mm, an overall edge length of $$l_E = \frac{i_u}{j_e} = 230 \text{ mm}$$

would, in this case, be required to prevent constriction of the ignition line, with such edge length representing the total length of all of the emitters. When such edge length is divided among the main thyristor and one of more auxiliary arrangements, a value of approximately 1:3 has proved effective for the emitter edge lengths. Deviations either above or below this value, for example from 1:2 to 1:5 are possible. These values have to be in accordance with the dynamic current amplification of the individual stages. For the dimensioning of the first auxiliary arrangement it should be kept in mind that a uniform emitter current flow should be achieved with the usual control currents.

Figure 4:
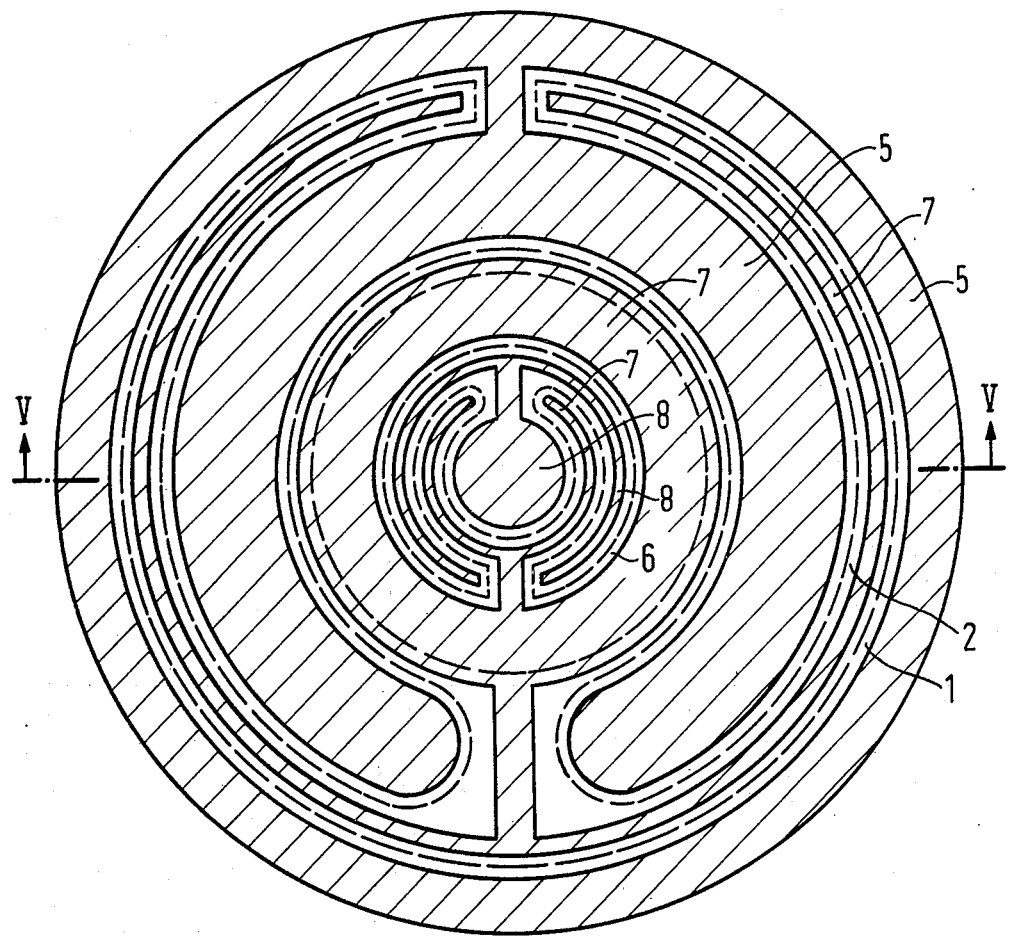
FIG. 4 is a plan view of a thyristor member with one auxiliary arrangement associated therewith.

In order to achieve the required long emitter edge lengths, the emitters expediently are designed with a strip configuration and interlaced with one another, similar to the interlacing of a plurality of comb structures. FIG. 4 illustrates a thyristor member to which this principle has been applied. As compared with known arrangements, featuring interrelated emitter zones, in which the control contacts are of circular configuration, the arrangement illustrated in FIG. 4 is provided with a control electrode 8 having strip or finger-shaped projections which are disposed between oppositely disposed portions or areas of an auxiliary emitter electrode 7, which is likewise provided with portions disposed between parts of the control electrode 8 and parts of the emitter electrode 5. The main emitter of the main thyristor is designated by the reference numeral 1 and the base zone which is common to both the main thyristor and the auxiliary arrangement is designated by the reference numeral 2. To improve the clarity of the figure, the electrodes illustrated have been lined.

Figure 5:
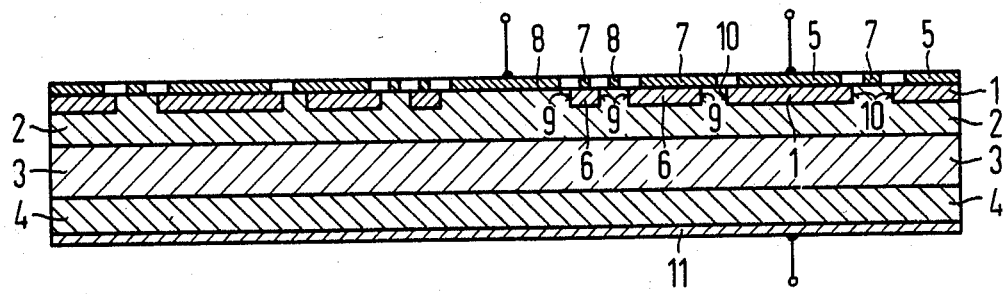
FIG. 5 is a section through the structure of FIG. 4 taken approximately on the line V—V.

FIG. 5 illustrates a sectional view of the thyristor member of FIG. 4, taken along the line V—V. The edge of the pn-junction between the emitter 1 and the base 2 is designated by the reference numeral 10, and the edge of the pn-junction between the auxiliary emitter 6 and the base 2 is designated by the reference numeral 9. The term "edge-length," heretofore employed in the description, refers to such edges. The exemplary embodiment illustrated in FIG. 4 has an edge length of 120 mm for the main thyristor consisting of the zones 1, 2, 3, 4 and the electrodes 5, 11, and an edge length of 40 mm for the auxiliary arrangement comprising the zones 6, 2, 3, 4 and the electrodes 7, 11.

It will also be appreciated that where additional auxiliary arrangements are employed, the configuration may be substantially merely a duplication of that illustrated in FIG. 4.

It will be appreciated from the above description that, while the auxiliary arrangement as illustrated comprises a thyristor, the auxiliary arrangement can also be in the form of a transistor, i.e., a three-layer structure. As the load current of a transistor can reach higher current values i.e. than a thyristor without the ignition line being constricted, it is possible to design a transistor with shorter emitter edge lengths. Thus, the length of the emitter edge need only be in accordance with the optimum dynamic current amplification. However, even in such case, the above mentioned conditions remain unchanged with respect to the main thyristor.

Figure 6:
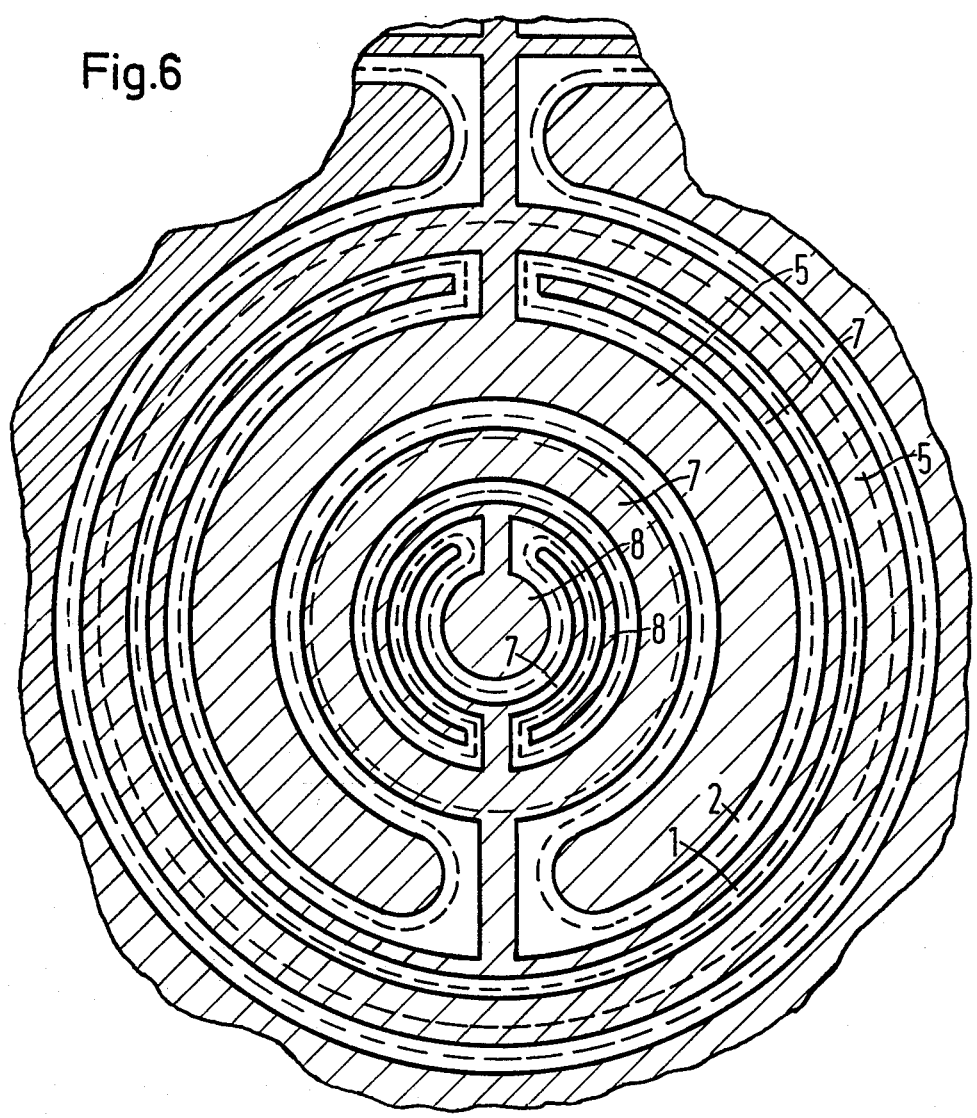
FIG. 6 is a partial plan view of a modified form of the invention.

FIG. 6 illustrates a modification of the invention and differs from FIG. 4 only in that the main emitter 5 and main emitter electrode are indicated in fragmentary fashion.

Figure 7:
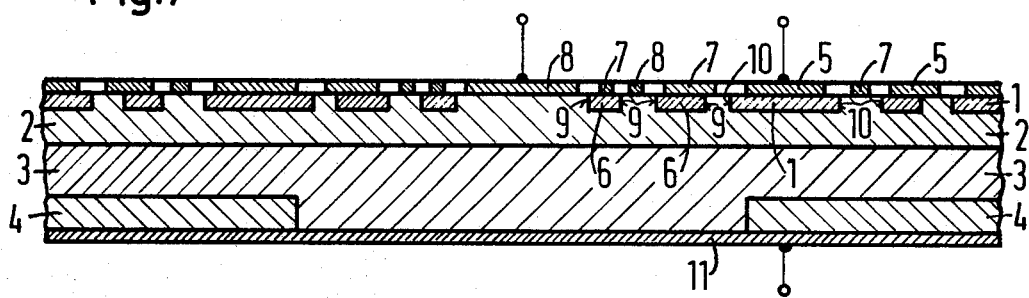
FIG. 7 is a sectional view of a modified form of the invention.

FIG. 7 differs from FIG. 5 in that the thyristor has three layers which forms a transistor in the middle. Note that in the center of FIG. 7 the second emitter 4 has been removed relative to FIG. 5 so that the second base 3 extends to and contacts the electrode 11.

The other elements of FIGS. 6 and 7 are the same as those of FIGS. 4 and 5, respectively, and their description will not be repeated.

Having thus described my invention it will be obvious that although various minor modifications might be suggested by those versed in the art, it should be understood that I wish to embody within the scope of the patent granted hereon all such modifications as reasonably and properly come within the scope of my contribution to the art.

I claim as my invention:

1. In a thyristor with a semiconductor element, which includes a main thyristor and at least one auxiliary arrangement which amplifies the control current, the main thyristor having a main emitter and the auxiliary arrangement having an auxiliary emitter, and a base which is common to the main thyristor and the auxiliary arrangement, with pn-junctions lying between the base and the emitters, emitter electrodes being disposed on the emitters, and a control electrode connected to the base wherein the edge lengths of the emitters of the main thyristor and the auxiliary arrangement have ratio such that the current $i_e$ is greater than $i_u''$, where $i_e$ is determined by the product of the emitter edge length and the line current density $j_e$ which has a value in the range between 0.3 and 1.0 amperes per milimeter of emitter edge length, and the current $i_u''$ is that load current at which the voltage across the thyristor has fallen to 10% or less of the breakover voltage.

2. A thyristor according to claim 1, wherein the auxiliary arrangement is a thyristor.

3. A thyristor according to claim 1, wherein the auxiliary arrangement is a transistor.

4. A thyristor according to claim 1, wherein the emitters, emitter electrodes, and the control electrode are, at least in part, of strip-like configuration and interlaced with one another in the manner of combs.

5. A thyristor according to claim 4, wherein the ratios of the emitter edge lengths of the auxiliary arrangement to the main thyristor are between 1:2 and 1:5.

6. A thyristor according to claim 5, wherein the ratios of the emitter edge lengths of the auxiliary arrangement to the main thyristor is 1:3.

7. A thyristor according to claim 6, wherein the auxiliary arrangement is a thyristor.

8. A thyristor according to claim 6, wherein the auxiliary arrangement is a transistor.

9. A thyristor according to claim 1, wherein a plurality of auxiliary arrangements are provided which lie between the control electrode and the main thyristor, with the edge lengths of the emitters of all such auxiliary arrangements being so selected that the current $i_{e1}$ is greater than $i_{u1}''$, and $i_{e2}$ is greater than $i_{u2}''$.

10. A thyristor according to claim 9, wherein the emitters, emitter electrodes, and the control electrode are, at least in part, of strip-like configuration and interlaced with one another in the manner of combs.

11. A thyristor according to claim 10, wherein the ratios of the emitter edge lengths of the consecutive auxiliary arrangements and of one auxiliary arrangement to the main thyristor are between 1:2 and 1:5.

12. A thyristor according to claim 11, wherein the ratios of the emitter edge lengths of the auxiliary arrangements and the main thyristor is 1:3.

13. A thyristor according to claim 12, wherein the auxiliary arrangements are thyristors.

14. A thyristor according to claim 12, wherein the auxiliary arrangements are transistors.

* * * * *